United States Patent
Frickey, III et al.

(10) Patent No.: US 8,332,578 B2
(45) Date of Patent: Dec. 11, 2012

(54) METHOD AND SYSTEM TO IMPROVE THE PERFORMANCE OF A MULTI-LEVEL CELL (MLC) NAND FLASH MEMORY

(75) Inventors: Robert E. Frickey, III, Sacramento, CA (US); Jonathan M. Hughes, Thornton, CO (US)

(73) Assignee: Intel Corporation, Santa Clara, CA (US)

( * ) Notice: Subject to any disclaimer, the term of this patent is extended or adjusted under 35 U.S.C. 154(b) by 648 days.

(21) Appl. No.: 12/533,358

(22) Filed: Jul. 31, 2009

(65) Prior Publication Data

US 2011/0029718 A1 Feb. 3, 2011

(51) Int. Cl.
*G06F 12/00* (2006.01)
(52) U.S. Cl. .............................. 711/103; 711/E12.008
(58) Field of Classification Search .................. 711/103, 711/E12.008
See application file for complete search history.

(56) References Cited

U.S. PATENT DOCUMENTS 7,558,130 B2 * 7/2009 Grunzke ........................ 365/191
2010/0042772 A1 * 2/2010 Bonella et al. ................ 711/103

* cited by examiner

*Primary Examiner* — Kevin Verbrugge
(74) *Attorney, Agent, or Firm* — Konrad Raynes Davda & Victor LLP; David W. Victor

(57) ABSTRACT

A method and system to improve the performance of a multi-level cell (MLC) NAND flash memory. In one embodiment of the invention, the metadata associated with the data stored in a MLC NAND flash memory is stored only in one or more lower pages of the MLC NAND flash memory. The MLC NAND flash memory has lower and upper pages, where the lower pages have a faster programming time or rate than the upper pages in one embodiment of the invention. By storing the metadata only in the pages of the MLC NAND flash memory that have low latencies of programming, the quality of service (QoS) of the MLC NAND flash memory can be improved.

28 Claims, 3 Drawing Sheets

| 412<br>Even lower pages | 414<br>Odd lower pages | 416<br>Even upper pages | 418<br>Odd upper pages |
|---|---|---|---|
| 0 | 1 | 4 | 5 |
| 2 | 3 | 8 | 9 |
| 6 | 7 | 12 | 13 |
| 10 | 11 | 16 | 17 |
| ⋮ | ⋮ | ⋮ | ⋮ |
| 114 | 115 | 120 | 121 |
| 118 | 119 | 124 | 125 |
| 122 | 123 | 126 | 127 |

METHOD AND SYSTEM TO IMPROVE THE PERFORMANCE OF A MULTI-LEVEL CELL (MLC) NAND FLASH MEMORY

FIELD OF THE INVENTION

This invention relates to a NAND flash memory, and more specifically but not exclusively, to improve the performance of a multi-level cell NAND flash memory. BACKGROUND DESCRIPTION A multi-level cell (MLC) NAND flash memory stores more than one bit of information per memory cell. A solid-state drive that uses MLC NAND flash memories can have larger information storage capacity compared to a solid-state drive that uses single-level cell (SLC) NAND flash memories, which store only one bit of information per cell.

FIG. 1 illustrates a prior art sequence 100 of programming a MLC NAND flash memory. The MLC NAND flash memory is programmed per page and is assumed to store two bits of information per cell. The erased logic value of each cell of the MLC NAND flash memory is set to the binary value $11_b$. The lower page programming sequence 110 shows a voltage distribution of the cells of the MLC NAND flash memory. To program the lower bit of each MLC NAND flash memory cell from $11_b$ to $10_b$, the threshold voltage ($V_T$) of each MLC NAND flash memory cell is set to a voltage between 0.8 volts, which is the programmed voltage (pv10), and 1.8 volts. To erase the lower bit of each MLC NAND flash memory cell from $10_b$ to $11_b$, the $V_T$ of each MLC NAND flash memory cell is set to a voltage between −0.5 volts, which is the erased voltage (ev), and −2.5 volts.

The upper page programming sequence 120 shows another voltage distribution of the cells of the MLC NAND flash memory. To program the upper bit of each MLC NAND flash memory cell from $11_b$ to $01_b$, the threshold voltage (VT) of each MLC NAND flash memory cell is set to a voltage between 0.35 volts, which is the programmed voltage (pv01), and 0.8 volts. The programming of the other logic states of the MLC NAND flash memory cell is illustrated in FIG. 1 and shall not be described. Although a MLC cell can store more than one bit of information, the programming time required for each upper page is longer than the programming time required for each lower page. This reduces the efficiency of the MLC cell compared to a SLC cell.

BRIEF DESCRIPTION OF THE DRAWINGS

The features and advantages of embodiments of the invention will become apparent from the following detailed description of the subject matter in which.

DETAILED DESCRIPTION

Figure 1:
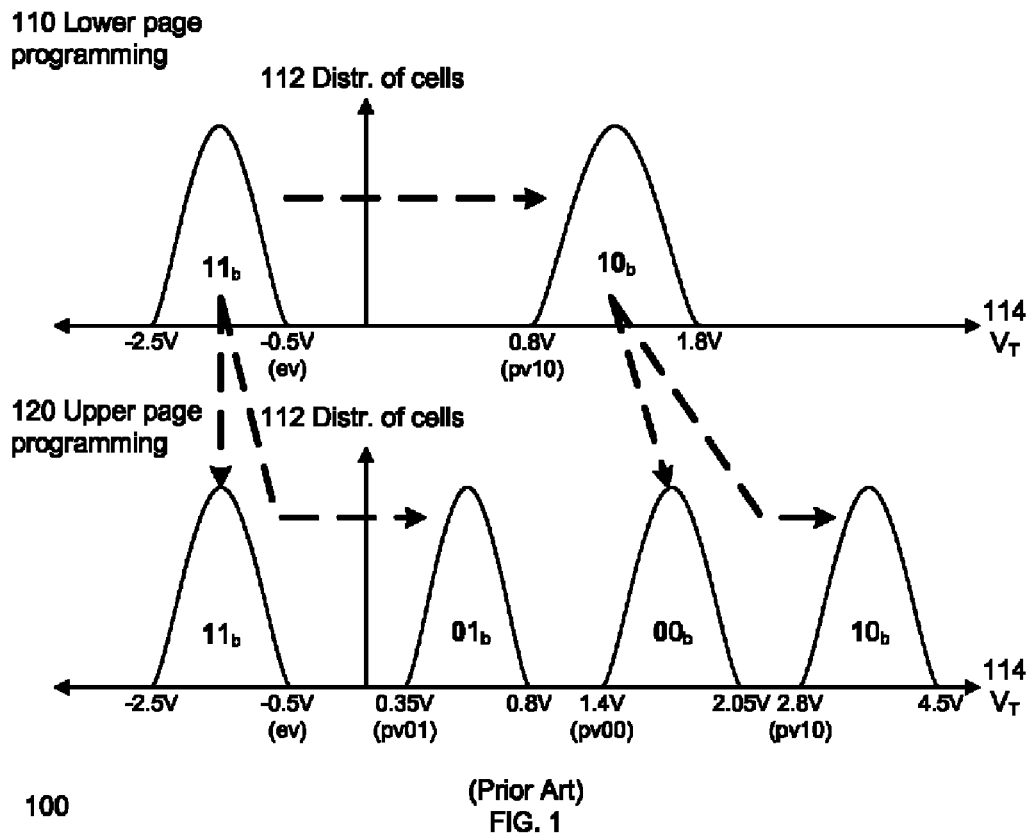
FIG. 1 illustrates a prior art sequence of programming a MLC NAND flash memory.

Embodiments of the invention described herein are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference numerals have been repeated among the figures to indicate corresponding or analogous elements. Reference in the specification to "one embodiment" or "an embodiment" of the invention means that a particular feature, structure, or characteristic described in connection with the embodiment is included in at least one embodiment of the invention. Thus, the appearances of the phrase "in one embodiment" in various places throughout the specification are not necessarily all referring to the same embodiment.

Embodiments of the invention provide a method and system to improve the performance of a multi-level cell NAND flash memory. In one embodiment of the invention, the metadata associated with the data stored in a MLC NAND flash memory is stored only in one or more lower pages of the MLC NAND flash memory. The MLC NAND flash memory has lower and upper pages, where the lower pages have a faster programming time or rate than the upper pages in one embodiment of the invention.

The metadata is used for the management of the stored information or data in the MLC NAND flash memory and the metadata includes, but is not limited to, a logical-to-physical address mapping table of the stored information, information of attributes of the stored information, and any other data that can assist in the management of the stored information.

By storing the metadata only in the pages of the MLC NAND flash memory that have low latencies of programming, the quality of service (QoS) of the MLC NAND flash memory can be improved. For example, in one embodiment of the invention, a solid-state drive (SSD) that uses one or more MLC NAND flash memories has a higher QoS as the SSD is able to write the metadata to the MLC NAND flash memories at a faster rate. An indicator of the QoS of the SSD is the response time of the SSD to any host commands such as write or read commands. When the SSD performs frequent writing of the metadata to the MLC NAND flash memories, increasing the rate of writing of the metadata allows the SSD to complete the writing of the metadata faster and therefore allows the SSD to respond faster to any host commands for read and write operation.

Figure 2:
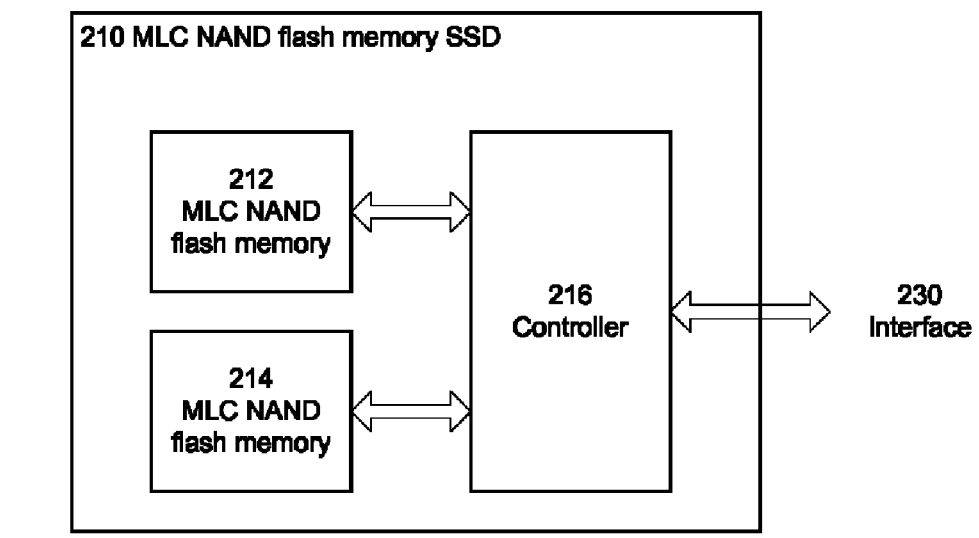
FIG. 2 illustrates a MLC NAND flash memory solid-state drive in accordance with one embodiment of the invention.

FIG. 2 illustrates a block diagram 200 of a MLC NAND flash memory SSD 210 in accordance with one embodiment of the invention. The MLC NAND flash memory SSD 210 has a controller 216 that is connected to the MLC NAND flash memories 212 and 214. In one embodiment of the invention, the MLC NAND flash memory 212 has a first set of pages and a second set of pages, where each page of the first set of pages has a lower programming latency than each page of the second set of pages.

The controller 216 allocates or designates at least one page of the first set pages to store the metadata or meta-information of the data stored in the MLC NAND flash memory 212. The controller 216 stores the metadata associated with the data stored in the MLC NAND flash memory 212 only in the first set of pages in one embodiment of the invention. The data stored in the MLC NAND flash memory 212 can be stored in either the first set of pages or the second set of pages of the MLC NAND flash memory 212. The controller 216 has an interface 230 to a host system and the interface 230 includes, but is not limited to, control signals, data signals, communication signals, and the like.

The MLC NAND flash memory 214 in the MLC NAND flash memory SSD 210 shows that there can be more than one MLC NAND flash memory in one embodiment of the invention. One of ordinary skill in the relevant art will readily appreciate that there can be other configurations of the MLC NAND flash memory in the MLC NAND flash memory SSD and these other configurations are applicable to the invention without affecting the workings of the invention.

Figures 3, 4:
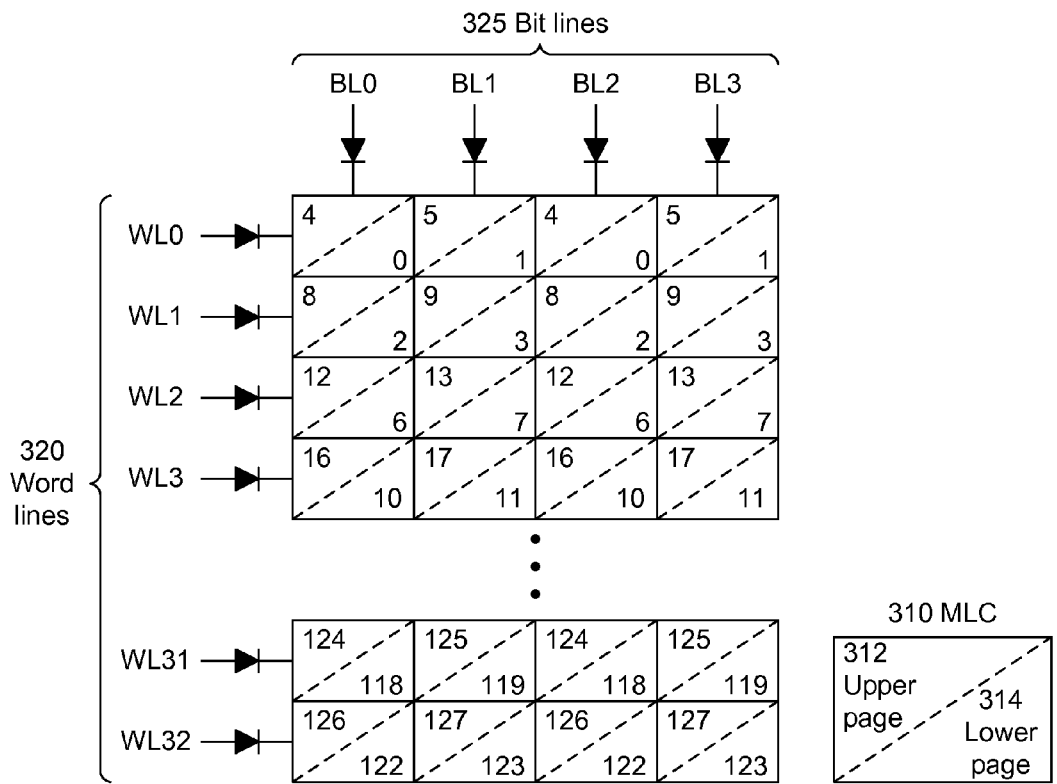
FIG. 3 illustrates an arrangement of a block of pages in a MLC NAND flash memory in accordance with one embodiment of the invention.
FIG. 4 illustrates a page scheme of a MLC NAND flash memory in accordance with one embodiment of the invention.

FIG. 3 illustrates an arrangement 300 of a block of pages in a MLC NAND flash memory in accordance with one embodiment of the invention. The arrangement 300 assumes that there are 128 pages, i.e., page 0 to page 127, in a block of the MLC NAND flash memory and each MLC is assumed to be able to store two bits of information, i.e., an upper (most significant) bit and a lower (least significant) bit. In another embodiment of the invention, there are more than 128 pages in a block of the MLC NAND flash memory. In yet another embodiment of the invention, there are less than 128 pages in a block of the MLC NAND flash memory.

The word lines 320 and bit lines 325 allow access to each page of the block of pages. For clarity of illustration, FIG. 3 shows only one MLC of each page of the block of pages in the MLC NAND flash memory. The MLC 310 illustrates the structure or arrangement of each MLC of each page of the block of pages in the MLC NAND flash memory. The upper bit of the MLC 310 belongs to the upper page 312 and the lower bit of the MLC 310 belongs to the lower page 314. For example, in one embodiment of the invention, the MLC accessible by bit line 0 (BL0) and word line 0 (WL0) has an upper bit that is part of page 4 and a lower bit that is part of page 0. Similarly, the MLC accessible by bit line 3 (BL3) and word line 3 (WL3) has an upper bit that is part of page 17 and a lower bit that is part of page 11. One of ordinary skill in the relevant art will readily appreciate how to determine the association of each upper and lower bit of each MLC with the respective pages and therefore shall not be described herein.

In one embodiment of the invention, each lower bit or least significant bit of a particular MLC has a faster programming rate than each upper bit or most significant bit of the particular MLC. To achieve a higher QoS or to improve the performance of the MLC NAND flash memory, the metadata associated with the data stored in the MLC NAND flash memory is stored only in the lower pages of the MLC NAND flash memory.

Although the MLC is assumed to store only two bits of information per MLC in FIG. 3, this is not meant to be limiting. In another embodiment of invention, each MLC can store more than two bits of information. For example, in one embodiment of the invention, each MLC stores 4 bits of information and the programming time required to program the 4 bits is in increasing order from the least significant bit to the most significant bit. The metadata is stored in the pages that have the lowest or one of the lowest programming time requirements in one embodiment of the invention.

One of ordinary skill in the relevant art will readily appreciate other methods of utilizing the pages that have the fastest or one of the fastest programming rate of a MLC NAND flash memory to store the metadata associated with the information stored in the MLC NAND flash memory and these other methods are also applicable to the invention. The arrangement 300 shown in FIG. 3 is not meant to be limiting. In another embodiment of the invention, other methods of arranging the pages of the block of pages are applicable to the invention without affecting the workings of the invention.

FIG. 4 illustrates a page scheme 400 of a MLC NAND flash memory in accordance with one embodiment of the invention. For clarity of illustration, FIG. 4 is discussed with reference to FIGS. 2 and 3. The even lower pages 412 has 32 pages from 0, 2, 6, 10, ..., 114, 118, to 122 and the odd lower pages 414 has 32 pages from 1, 3, 7, 11, ..., 115, 119, to 123. Similarly, the even upper pages 416 has 32 pages from 4, 8, 12, 16, ..., 120, 124, to 126 and the odd upper pages 418 has 32 pages from 5, 9, 13, 17, ..., 121, 125, to 127. In one embodiment of the invention, each page of the even lower pages 412 and the odd lower pages 414 has a lower latency of programming than each page of the even upper pages 416 and the odd upper pages 418.

When the MLC NAND flash memory 212 has a block of pages that has a similar arrangement as shown in FIG. 3, the controller 216 allocates at least one of the pages from the even lower pages 412 and the odd lower pages 414 to store the metadata associated with the data stored in the MLC NAND flash memory 212 in one embodiment of the invention. By using only half of the available pages in a block of pages to store metadata, the capacity of the MLC NAND flash memory 212 is traded-off or exchanged for an increase in performance and/or QoS in one embodiment of the invention.

In another embodiment of the invention, the controller can allocate more than 64 pages in the MLC NAND flash memory 212 to store the metadata associated with the information stored in the MLC NAND flash memory. In yet another embodiment of the invention, the controller 216 selects one or more block of pages and utilizes each MLC of each page of the one or more block of pages as a single-level cell (SLC) only, i.e., stores only one bit of information in each MLC. The controller 216 stores the metadata only in the selected one or more blocks of pages in one embodiment of the invention. In one embodiment of the invention, the MLC NAND flash memory 212 is compliant at least in part with an Open NAND Flash Interface (ONFI) protocol.

Figure 5:
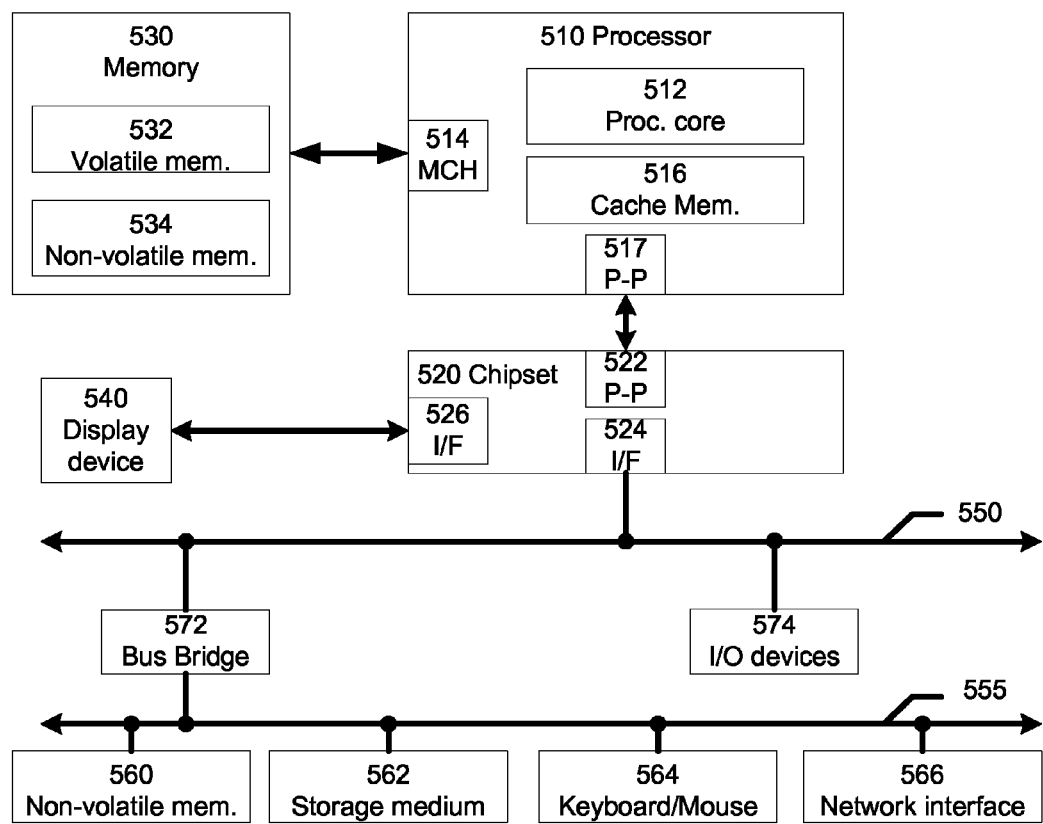
FIG. 5 illustrates a system to implement the methods disclosed herein in accordance with one embodiment of the invention.

FIG. 5 illustrates a system 500 to implement the methods disclosed herein in accordance with one embodiment of the invention. The system 500 includes, but is not limited to, a desktop computer, a laptop computer, a netbook, a notebook computer, a personal digital assistant (PDA), a server, a workstation, a cellular telephone, a mobile computing device, an Internet appliance or any other type of computing device. In another embodiment, the system 500 used to implement the methods disclosed herein may be a system on a chip (SOC) system.

The processor 510 has a processing core 512 to execute instructions of the system 500. The processing core 512 includes, but is not limited to, pre-fetch logic to fetch instructions, decode logic to decode the instructions, execution logic to execute instructions and the like. The processor 510 has a cache memory 516 to cache instructions and/or data of the system 500. In another embodiment of the invention, the cache memory 516 includes, but is not limited to, level one, level two and level three, cache memory or any other configuration of the cache memory within the processor 510.

The memory control hub (MCH) 514 performs functions that enable the processor 510 to access and communicate with a memory 530 that includes a volatile memory 532 and/or a non-volatile memory 534. The volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 534 includes, but is not limited to, MLC NAND flash memory, phase change memory (PCM), read only memory (ROM), electrically erasable programmable read only memory (EEPROM), or any other type of non-volatile memory device.

The memory 530 stores information and instructions to be executed by the processor 510. The memory 530 may also stores temporary variables or other intermediate information while the processor 510 is executing instructions. The chipset 520 connects with the processor 510 via Point-to-Point (PtP) interfaces 517 and 522. The chipset 520 enables the processor 510 to connect to other modules in the system 500. In one embodiment of the invention, the interfaces 517 and 522 operate in accordance with a PtP communication protocol such as the Intel® QuickPath Interconnect (QPI) or the like. The chipset 520 connects to a display device 540 that includes, but is not limited to, liquid crystal display (LCD), cathode ray tube (CRT) display, or any other form of visual display device.

In addition, the chipset 520 connects to one or more buses 550 and 555 that interconnect the various modules 574, 560, 562, 564, and 566. Buses 550 and 555 may be interconnected together via a bus bridge 572 if there is a mismatch in bus speed or communication protocol. The chipset 520 couples with, but is not limited to, a MLC NAND flash memory SSD 560, a mass storage device(s) 562, a keyboard/mouse 564 and a network interface 566. The mass storage device 562 includes, but is not limited to, a solid state drive, a hard disk drive, an universal serial bus flash memory drive, or any other form of computer data storage medium.

The network interface 566 is implemented using any type of well known network interface standard including, but not limited to, an Ethernet interface, a universal serial bus (USB) interface, a Peripheral Component Interconnect (PCI) Express interface, a wireless interface and/or any other suitable type of interface. The wireless interface operates in accordance with, but is not limited to, the Institute of Electrical and Electronics Engineers (IEEE) 802.11 standard ("IEEE standard 802.11-2007, published Jun. 12, 2007") and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although the cache memory 516 is depicted as a separate block within the processor 510, the cache memory 516 can be incorporated into the processor core 512 respectively. The system 500 may include more than one processor/processing core in another embodiment of the invention.

The methods disclosed herein can be implemented in hardware, software, firmware, or any other combination thereof. Although examples of the embodiments of the disclosed subject matter are described, one of ordinary skill in the relevant art will readily appreciate that many other methods of implementing the disclosed subject matter may alternatively be used. In the preceding description, various aspects of the disclosed subject matter have been described. For purposes of explanation, specific numbers, systems and configurations were set forth in order to provide a thorough understanding of the subject matter. However, it is apparent to one skilled in the relevant art having the benefit of this disclosure that the subject matter may be practiced without the specific details. In other instances, well-known features, components, or modules were omitted, simplified, combined, or split in order not to obscure the disclosed subject matter.

The term "is operable" used herein means that the device, system, protocol etc, is able to operate or is adapted to operate for its desired functionality when the device or system is in off-powered state. Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

The techniques shown in the figures can be implemented using code and data stored and executed on one or more computing devices such as general purpose computers or computing devices. Such computing devices store and communicate (internally and with other computing devices over a network) code and data using machine-readable media, such as machine readable storage media (e.g., magnetic disks; optical disks; random access memory; read only memory; flash memory devices; phase-change memory) and machine readable communication media (e.g., electrical, optical, acoustical or other form of propagated signals—such as carrier waves, infrared signals, digital signals, etc.).

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. A method comprising:
storing metadata in one or more lower pages of a multi-level cell (MLC) NAND flash memory having a plurality of MLCs, each having an upper bit and a lower bit; and
storing user data in upper pages of the MLC NAND flash memory, wherein in each of a plurality of MLCs of the NAND flash memory, an upper bit of the MLC has the user data for one of the upper pages and a lower bit of the MLC has the metadata for one of the lower pages.

2. The method of claim 1, wherein the lower bits of the MLCs have a faster programming time than the upper bits of the MLCs.

3. The method of claim 1, wherein the metadata is associated with data stored in the MLC NAND flash memory.

4. The method of claim 3, where the metadata comprises one of a logical-to-physical address mapping table of the data, and information of attributes of the data.

5. The method of claim 1, where the MLC NAND flash memory is compliant at least in part with an Open NAND Flash Interface (ONFI) protocol.

6. The method of claim 1, further comprising:
selecting the one or more lower pages of the multi-level cell (MLC) NAND flash memory; and
facilitating each MLC cell of each selected lower page to be used as a single-level cell only, wherein storing the metadata only in the one or more lower pages of the MLC NAND flash memory comprises storing the metadata only in the selected one or more lower pages of the MLC NAND flash memory.

7. A controller coupled to a multi-level cell (MLC) NAND flash memory having a plurality of MLCs, each having an upper bit and a lower bit, comprising:
logic to:
allocate at least one memory page of the MLC NAND flash memory to store metadata of data stored in the MLC NAND flash memory;
store the metadata of the data in the at least one allocated memory page of the MLC NAND flash memory; and
store user data in upper pages of the MLC NAND flash memory, wherein in each of a plurality of MLCs of the NAND flash memory, an upper bit of the MLC has the user data for one of the upper pages and a lower bit of the MLC has the metadata for one of the lower pages.

8. The controller of claim 7, wherein the lower bits of the MLCs have a faster programming speed than the upper bits of the MLCs.

9. The controller of claim 7, wherein the logic is further to update the stored metadata.

10. The controller of claim 7, wherein the logic is further to access each MLC of the least one allocated memory page of the multi-level cell (MLC) NAND flash memory as a single-level cell (SLC) only.

11. The controller of claim 7, wherein the metadata comprises one of a logical-to-physical address mapping table of the data, and the metadata of attributes of the data.

12. The controller of claim 7, where the MLC NAND flash memory is compliant at least in part with an Open NAND Flash Interface (ONFI) protocol.

13. The controller of claim 7, wherein the logic is a firmware in the controller.

14. An apparatus comprising:
a multi-level cell (MLC) NAND flash memory having a plurality of MLCs, each having an upper bit and a lower bit, and including a first set of pages and a second set of pages; and
a controller coupled with the MLC NAND flash memory to:
store metadata in at least one page of the first set of pages; and
store user data in the second set of pages of the MLC NAND flash memory, wherein in each of a plurality of MLCs of the NAND flash memory, an upper bit of the MLC has the user data for one of the second set pages and a lower bit of the MLC has the metadata for one of the first set of pages.

15. The apparatus of claim 14, wherein the metadata is associated with data stored in either the first set of pages or the second set of pages of the MLC NAND flash memory.

16. The apparatus of claim 14, wherein the controller is further to update the stored metadata.

17. The apparatus of claim 15, where the metadata comprises one of a logical-to-physical address mapping table of the data, and information of attributes of the data.

18. The apparatus of claim 14, where the apparatus is compliant at least in part with an Open NAND Flash Interface (ONFI) protocol.

19. The apparatus of claim 14, wherein the controller is further to utilize each MLC of the least one page of the first set of pages as a single-level cell (SLC) only.

20. The method of claim 1, wherein for at least one of the MLCs, the lower bit and the upper bit have data for different pages.

21. The method of claim 1, wherein the lower bits of the MLCs have data for even and odd numbered pages that are different than even and odd numbered pages stored in the upper bits of the MLCs.

22. The method of claim 1, wherein data for a first half of available pages are stored in the upper bits of the MLCs and data for a second half of available pages are stored in the lower bits of the MLCs.

23. The controller of claim 7, wherein for at least one of the MLCs, the lower bit and the upper bit have data for different pages.

24. The controller of claim 7, wherein the lower bits of the MLCs have data for even and odd numbered pages that are different than even and odd numbered pages stored in the upper bits of the MLCs.

25. The controller of claim 7, wherein data for a first half of available pages are stored in the upper bits of the MLCs and data for a second half of available pages are stored in the lower bits of the MLCs.

26. The apparatus of claim 14, wherein for at least one of the MLCs, the lower bit and the upper bit have data for different pages.

27. The apparatus of claim 14, wherein the lower bits of the MLCs have data for even and odd numbered pages that are different than even and odd numbered pages stored in the upper bits of the MLCs.

28. The apparatus of claim 14, wherein data for a first half of available pages are stored in the upper bits of the MLCs and data for a second half of available pages are stored in the lower bits of the MLCs.

* * * * *